(12) United States Patent
Furuichi

(10) Patent No.: US 6,504,187 B1
(45) Date of Patent: Jan. 7, 2003

(54) SEMICONDUCTOR INTEGRATED CIRCUIT AND DIGITAL CAMERA COMPRISING THE SAME

(75) Inventor: Shinji Furuichi, Shiga (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/666,477

(22) Filed: Sep. 20, 2000

(30) Foreign Application Priority Data

Sep. 30, 1999 (JP) ............................................. 11-278776
Aug. 30, 2000 (JP) ....................................... 2000-261937

(51) Int. Cl.[7] .............................................. H01L 27/10
(52) U.S. Cl. ...................................... 257/207; 257/758
(58) Field of Search ................................ 257/207, 758, 257/211

(56) References Cited

U.S. PATENT DOCUMENTS 5,742,099 A * 4/1998 Debnath et al. ............ 257/207

FOREIGN PATENT DOCUMENTS

JP 8-125025 5/1996

* cited by examiner

*Primary Examiner*—Mark V. Prenty
(74) *Attorney, Agent, or Firm*—McDermott, Will & Emery

(57) ABSTRACT

A semiconductor capable of saving the circuit area is obtained. This semiconductor integrated circuit comprises a macro cell part having a plurality of wiring layers, an internal wire of the macro cell part formed by the wiring layers of the macro cell part and a main power supply wire formed by the wiring layers of the macro cell part and arranged in the region of the macro cell part. Thus, the main power supply wire is arranged in the region of the macro cell part, whereby the circuit area can be saved as compared with the case of arranging the main power supply wire outside the region of the macro cell part.

30 Claims, 3 Drawing Sheets

SEMICONDUCTOR INTEGRATED CIRCUIT AND DIGITAL CAMERA COMPRISING THE SAME

BACKGROUND OF THE INVENTION

1. Field of the Invention

The present invention relates to a semiconductor integrated circuit and a digital camera comprising the same, and more specifically, it relates to a semiconductor integrated circuit having a large-scale macro cell part such as a CPU and a digital camera comprising the same.

2. Description of the Prior Art

An ASIC (application specific integrated circuit) readily implementing a device for a specific application with CAD (computer aided design) is known in general. As to a method of designing such an ASIC, a gate array system, a standard cell system and an embedded array system are generally known as methods of efficiently designing semicustom LSIs.

In the gate array system, basic cells covered with transistors in an arrayed manner are arranged and wired for forming a logic circuit. The gate array system requires only a wiring step as the fabrication step, and hence a TAT (turnaround time) between completion of design and trial manufacture of a sample is advantageously reduced.

In the standard cell system, optimally designed verified logic circuit cells and a macro cell part are previously registered in a CAD database and arbitrarily combined with each other through CAD. However, this standard cell system employs a mask specific to a type from a transistor forming step, and hence fabrication cannot be started until the design is completed. In the standard cell system, therefore, the TAT is inconveniently lengthened as compared with the gate array system. On the other hand, a large-scale macro cell part such as a CPU or a memory can advantageously be readily designed in this standard cell system.

The embedded array system adopts advantages of the gate array system and the standard cell system. An embedded array employed in the embedded array system has a structure obtained by embedding a macro cell part of standard cells in a random logic part of a gate array. After deciding the number of gates of the random logic part and the type of the embedded macro cell part, fabrication of a wafer is immediately started to advance fabrication of the embedded array up to a stage preceding a wiring step. Completion of logical design is waited in this state. After termination of a logic simulation, an LSI is completed by simply wiring the random logic part.

In the embedded array system, the macro cell part of the standard cells is previously registered and hence parts other than the macro cell part are designed. Therefore, the macro cell part of the standard cells may not be embodied to a transistor unit level and hence the TAT can be reduced for the standard cells. Further, circuits forming the random logic part can be changed only through the wiring step.

When designing the aforementioned conventional ASIC, power supply wires (a power supply potential line and a ground potential line) are necessary for fixing signal lines in the circuit to a power supply potential and a ground potential. In a technique disclosed in Japanese Patent Laying-Open No. 8-125025 (1996), for example, a main power supply potential line (power supply trunk) and a main ground potential line (ground trunk) serving as main power supply wires are provided in the form of rings enclosing a microcomputer core serving as a macro cell part in design of an ASIC microcomputer. The microcomputer core is provided therein with an auxiliary power supply potential line (power supply wire) and an auxiliary ground potential line (ground wire) for electrically connecting the main power supply potential line and the main ground potential line set outside the region of the microcomputer core with elements provided in the microcomputer core.

In the aforementioned conventional structure, however, the main power supply potential line and the main ground potential line present outside the region of the microcomputer core serving as the macro cell part disadvantageously inhibit reduction of the area of the circuit.

In particular, a large quantity of current flows through the main power supply potential line and the main ground potential line for supplying a power supply potential and a ground potential to the overall microcomputer core. Therefore, the main power supply potential line and the main ground potential line must be increased in width in order to prevent electromigration a voltage drop resulting from wire resistance. Such wide main power supply wires (the main power supply potential line and the main ground potential line) are generally set outside the region of the microcomputer core, and hence the circuit area is disadvantageously increased.

SUMMARY OF THE INVENTION

An object of the present invention is to provide a semiconductor integrated circuit capable of saving the area.

Another object of the present invention is to improve a margin for wiring in a macro cell part of a semiconductor integrated circuit.

Still another object of the present invention is to increase the degree of freedom in layout of internal wires in a macro cell part of a semiconductor integrated circuit and improving wiring efficiency for the internal wires.

A further object of the present invention is to provide a digital camera comprising the aforementioned semiconductor integrated circuit.

A semiconductor integrated circuit according to an aspect of the present invention comprises a macro cell part having a plurality of wiring layers, an internal wire of the macro cell part formed by the wiring layers of the macro cell part and a main power supply wire formed by the wiring layers of the macro cell part and arranged in the region of the macro cell part. In the semiconductor integrated circuit according to this aspect, the main power supply wire is so arranged in the region of the macro cell part that the area of the circuit can be saved as compared with the conventional case of arranging the main power supply wire outside the region of the macro cell part.

In the semiconductor integrated circuit according to the aforementioned aspect, the main power supply wire preferably includes a plurality of first main power supply wires formed by the same wiring layer. In this case, the main power supply wire preferably includes a second main power supply wire connecting the first main power supply wires with each other.

In the semiconductor integrated circuit according to the aforementioned aspect, the macro cell part preferably has a multilayer wiring structure, and the main power supply wire is formed by an arbitrary wiring layer of multilayer wiring in the macro cell part. The semiconductor integrated circuit further comprises a connection wiring layer formed by another wiring layer of multilayer wiring in the macro cell part and electrically connected with the main power supply wire. When the macro cell part has a multilayer wiring structure in the aforementioned manner, a margin for wiring in the macro cell part can be improved. Consequently, the main power supply wire can be readily arranged in the region of the macro cell part.

In this case, the main power supply wire and the connection wiring layer are preferably connected with each other by a connection hole wire. More preferably, the main power supply wire and the connection wiring layer are connected with each other by at least two connection hole wires. When connecting the main power supply wire and the connection wiring layer with each other by at least two connection hole wires as described above, resistance between the main power supply wire and the connection wiring layer is reduced as compared with the case of connecting the same by a single connection hole wire, and hence a voltage drop across the main power supply wire and the connection wiring layer can be reduced. The width of the connection wiring layer is preferably substantially equal to the width of the main power supply wire. In this case, at least two connection hole wires can be readily formed between the connection wiring layer having a width substantially identical to that of the wide main power supply wire and the main power supply wire. Consequently, a voltage drop across the main power supply wire and the connection wiring layer can be readily reduced.

In this case, the macro cell part preferably includes a cell string having a semiconductor element, and the cell string having the semiconductor element is arranged under the main power supply wire. When the macro cell part has a multilayer wiring structure as described above, the cell string having the semiconductor element can be arranged under the main power supply wire. Consequently, signal lines between such cell strings can be readily connected with no hindrance by the main power supply wire. In this case, the macro cell part preferably includes a cell region consisting of a plurality of cell strings, an auxiliary power supply wire is preferably connected to the main power supply wire through the connection wiring layer, and the auxiliary power supply wire is preferably formed to extend along the longitudinal direction of the cell strings of the cell region.

Preferably, the main power supply wire includes a plurality of first main power supply wires prepared from a first wiring layer and a second main power supply wire prepared from a second wiring layer for connecting the first main power supply wires with each other. In this case, the macro cell part preferably has at least three wiring layers, for forming either the first main power supply wires or the second main power supply wire by the uppermost wiring layer while forming either the second main power supply wire or the first main supply wires by the wiring layer next to the uppermost wiring layer. Thus, signal lines between the cell strings can be readily connected with each other through the third and subsequent wiring layers with no hindrance by the main power supply wire.

In the semiconductor integrated circuit according to the aforementioned aspect, the main power supply wire preferably includes at least one of a high-potential side main power supply wire and a low-potential side main power supply wire. In this case, the high-potential side main power supply wire preferably includes a main power supply potential line, and the low-potential side main power supply wire preferably includes a main ground potential line.

In the semiconductor integrated circuit according to the aforementioned aspect, the main power supply wire is preferably at least partially subdivided. When the main power supply wire is at least partially subdivided, the width of the main power supply wire is reduced in the subdivided region. Thus, the degree of freedom in layout of the internal wires of the macro cell part is increased in the region as compared with a main power supply wire having a large width. Consequently, wiring efficiency for the internal wires of the macro cell part can be improved in the subdivided region of the main power supply wire.

In this case, a connection wiring layer is preferably connected to each of a plurality of subdivided main power supply wires. Further, an auxiliary power supply wire is preferably connected in common to the plurality of subdivided main power supply wires through the connection wiring layer. When connecting the auxiliary power supply wire in common to the plurality of subdivided main power supply wires through the connection wiring layer, the length of the auxiliary power supply wire connected between adjacent main power supply wires is reduced as compared with a main power supply wire not subdivided in the aforementioned manner. Thus, resistance of the auxiliary power supply wire is reduced between the main power supply wires. Consequently, a voltage drop across the main power supply wires can be reduced.

The plurality of subdivided main power supply wires are preferably arranged substantially at regular intervals. When arranging the main power supply wires substantially at regular intervals, dispersion of potentials caused by a voltage drop can be suppressed over the entire subdivided regions of the main power supply wires. Consequently, a malfunction resulting from a local voltage drop can be suppressed.

In this case, the macro cell part preferably includes a cell region of a standard cell system, and the main power supply wire is preferably subdivided in the cell region of the standard cell system. The macro cell part may include a cell region of a gate array system, and the main power supply wire may be subdivided in the cell region of the gate array system.

Preferably, the main power supply wire includes a plurality of first main power supply wires prepared from the same wiring layer. In this case, the main power supply wire preferably includes a second main power supply wire connecting the first main power supply wires with each other. The main power supply wire may include a third main power supply wire for connecting a plurality of subdivided parts of the main power supply wire with each other.

Preferably, the macro cell part has a multilayer wiring structure, and the main power supply wire is formed by an arbitrary wiring layer of multilayer wiring in the macro cell part. The semiconductor integrated circuit further comprises a connection wiring layer formed by another wiring layer of multilayer wiring in the macro cell part and electrically connected with the main power supply wire. When the macro cell part has a multilayer wiring structure in the aforementioned manner, a margin for wiring in the macro cell part can be improved. Consequently, the main power supply wire can be readily arranged in the region of the macro cell part.

In this case, the main power supply wire and the connection wiring layer are preferably connected with each other by a connection hole wire. Further, the macro cell part preferably includes a cell string having a semiconductor element, and the cell string having the semiconductor element is preferably arranged under the main power supply wire. When the macro cell part has a multilayer wiring structure as described above, the cell string having the semiconductor element can be arranged under the main power supply wire. Consequently, signal lines between such cell strings can be readily connected with no hindrance by the main power supply wire. In this case, the macro cell part preferably includes a cell region consisting of a plurality of cell strings, the main power supply wire is preferably subdivided in the cell region, an auxiliary power supply wire is preferably connected in common to the subdivided main power supply wire through the connection wiring layer, and the auxiliary power supply wire is preferably formed to extend along the longitudinal direction of the cell strings of the cell region.

In this case, the main power supply wire preferably includes a plurality of first main power supply wires prepared from a first wiring layer and a second main power supply wire prepared from a second wiring layer for connecting the first main power supply wires with each other. In this case, the macro cell part preferably has at least three wiring layers, for forming either the first main power supply wires or the second main power supply wire by the uppermost wiring layer while forming either the second main power supply wire or the first main supply wires by the wiring layer next to the uppermost wiring layer. Thus, signal lines between the cell strings can be readily connected with each other through the third and subsequent wiring layers with no hindrance by the main power supply wire.

Preferably, the main power supply wire includes at least one of a high-potential side main power supply wire and a low-potential side main power supply wire. In this case, the high-potential side main power supply wire preferably includes a main power supply potential line, and the low-potential side main power supply wire preferably includes a main ground potential line.

A digital camera according to another aspect of the present invention comprises a semiconductor integrated circuit including a macro cell part having a plurality of wiring layers, an internal wire of the macro cell part formed by the wiring layers of the macro cell part and a main power supply wire formed by the wiring layers of the macro cell part and arranged in the region of the macro cell part. In the digital camera according to this aspect comprising the semiconductor integrated circuit having the main power supply wire arranged in the region of the macro cell part, the area of the circuit forming the digital camera can be saved as compared with such a conventional case that the main power supply wire is arranged outside the region of the macro cell part.

A digital camera according to still another aspect of the present invention comprises a semiconductor integrated circuit including a macro cell part having a plurality of wiring layers, an internal wire of the macro cell part formed by the wiring layers of the macro cell part and a main power supply wire formed by the wiring layers of the macro cell part, arranged in the region of the macro cell part and at least partially subdivided. In the digital camera according to this aspect, the main power supply wire arranged in the region of the macro cell part is at least partially subdivided so that the width of the main power supply wire is reduced in the subdivided region. Thus, the degree of freedom in layout of the internal wire of the macro cell part is increased in this region as compared with a main power supply wire having a large width. Consequently, wiring efficiency for the internal wire of the macro cell part can be improved in the subdivided region of the main power supply wire. Thus, a digital camera including a macro cell part having high wiring efficiency can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
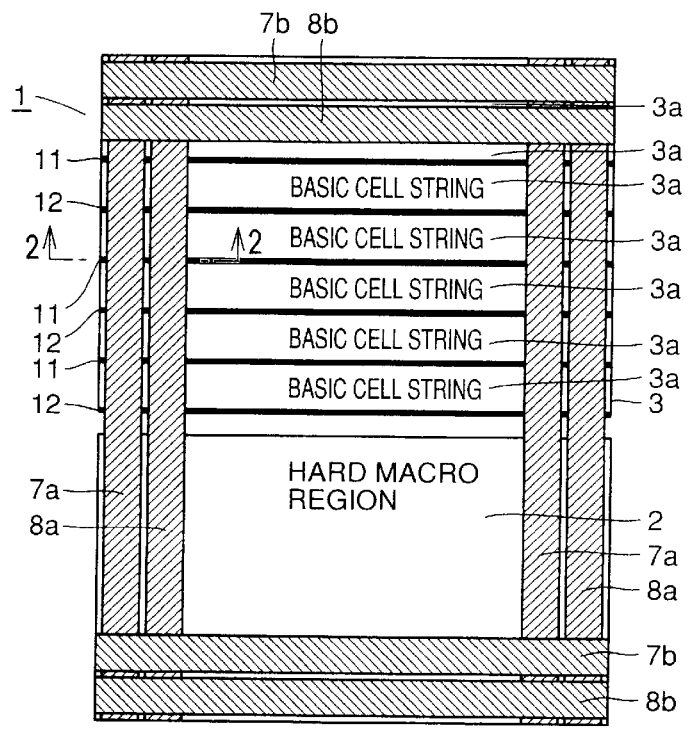
FIG. 1 is a plan view schematically showing the structure of a macro cell part of a semiconductor integrated circuit according to a first embodiment of the present invention.
Figure 2:
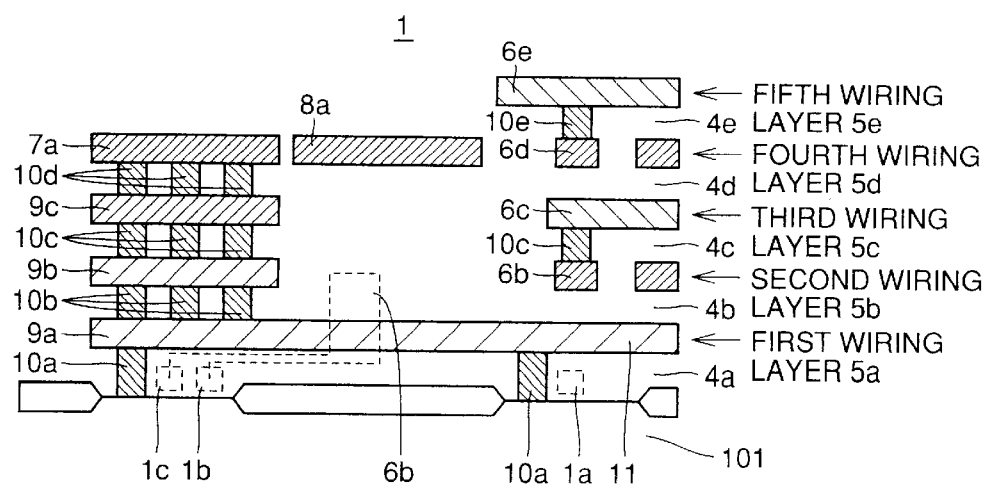
FIG. 2 is a sectional view of the macro cell part according to the first embodiment taken along the line 100—100 in FIG. 1.

Referring to FIGS. 1 and 2, a macro cell part 1 of a semiconductor integrated circuit according to a first embodiment of the present invention is a large-scale integrated circuit such as a RISC-CPU, a CISC-CPU, a RAM or a ROM loaded on a semiconductor chip, and more specifically, it corresponds to a RISC-CPU or a CISC-CPU in this embodiment. The macro cell part 1 is in the form of a rectangle consisting of a square hard macro region 2 and a square basic cell region 3. The basic cell region 3 is formed by arranging a plurality of basic cell strings 3a designed in the standard cell system. In the macro cell part 1, the hard macro region 2 corresponds to a core part of the RISC-CPU, the CISC-CPU, the RAM or the ROM, and more specifically, it corresponds to a RAM or a ROM in this embodiment. In the macro cell part 1, further, the basic cell region 3 corresponds to a random logic part such as a data path or a control part.

In the sectional structure of the macro cell part 1, various active elements such as transistors 1a to 1c are formed on a surface of a cell substrate 101, as shown in FIG. 2. Five wiring layers 5a, 5b, 5c, 5d and 5e are formed on the cell substrate 101. An interlayer isolation film 4a is formed between the cell substrate 101 and the first wiring layer 5a, while an interlayer isolation film 4b is formed between the first wiring layer 5a and the second wiring layer 5b. An interlayer isolation film 4c is formed between the second wiring layer 5b and the third wiring layer 5c, while an interlayer isolation film 4d is formed between the third wiring layer 5c and the fourth wiring layer 5d. An interlayer isolation film 4e is formed between the fourth wiring layer 5d and the fifth wiring layer 5e.

The wiring layers 5a to 5e are provided with internal wires 6a and 6e (the internal wire 6a is not shown in FIG. 2) respectively. The internal wires 6a and 6e are properly connected to complete logic, thereby implementing the function of the macro cell part 1. More specifically, a contact plug 10c connects the second-layer internal wire 6b with the third-layer internal wire 6c, while a contact plug 10e connects the fourth-layer internal wire 6d with the fifth-layer internal wire 6e.

A main power supply potential line (high-potential side power supply wire) 7a and a main ground potential line (low-potential side power supply wire) 8a serving as main power supply wires are arranged on the left end (the left end in FIG. 1) along the shorter side of the fourth wiring layer 5d to longitudinally extend in parallel with each other. Another main power supply potential line 7a and another main ground potential line 8a are similarly arranged on the right end (the right end in FIG. 1) along the shorter side of the fourth wiring layer 5d to longitudinally extend in parallel with each other. The first wiring layer 5a, the second wiring layer 5b and the third wiring layer 5c are provided with connection wiring layers 9a, 9b and 9c (see FIG. 2) for transmitting the potentials of the main power supply potential line 7a and the main ground potential line 8a to first-layer auxiliary power supply potential lines 11 and first-layer auxiliary ground potential lines 12 respectively.

Three contact plugs (connection hole wires) 10d connect the fourth-layer main power supply potential line 7a with the third-layer connection wire 9c. Three contact plugs 10c connect the third-layer connection wire 9c with the second-layer connection wire 9b. Three contact plugs 10b connect the second-layer connection wire 9b with the first-layer connection wire 9a. The contact plugs 10b, 10c and 10d correspond to the "connection hole wire" according to the present invention.

The auxiliary power supply potential lines 11 are provided to branch from the first-layer connection wire 9a. The cell substrate 101 and contact plugs 10a connect the first-layer connection wire 9a and the first-layer auxiliary power supply potential lines 11 with each other. An internal wire 6b connects the transistors 1b and 1c with each other.

In the sectional structure shown in FIG. 2, the contact plugs 10d for connecting the main power supply potential line 7a with the connection wire 9c, the contact plugs 10 c for connecting the connection wires 9c and 9b with each other and the contact plugs 10b for connecting the connection wires 9b and 9a with each other are preferably provided as many as possible in order to transmit the potential of the fourth-layer main power supply potential line 7a to the first-layer auxiliary power supply potential lines 11 with small loss. According to the first embodiment, therefore, the width of the connection wires 9a to 9c is set substantially identical to that of the wide main power supply potential line 7a. Thus, the three contact plugs 10d can connect the main power supply potential line 7a and the connection wire 9c, the three contact plugs 10c can connect the connection wires 9c and 9b with each other and the three contact plugs 10b can connect the connection wires 9b and 9c with each other respectively. Therefore, potential loss through the paths between the main power supply potential line 7a and the auxiliary power supply potential lines 11 can be reduced as compared with the case of providing single such contact plugs 10d, 10c and 10b. Consequently, voltage drops in these paths can be reduced.

FIG. 2 illustrates no connection wires and contact plugs corresponding to the main ground potential line 8a due to the position of the section. In this case, the connection wires and the contact plugs corresponding to the main ground potential line 8a have sectional structures similar to those of the connection wires 9a to 9c and the contact plugs 10b to 10d corresponding to the main power supply potential line 7a shown in FIG. 2.

Power supply potential lines 7b for connecting the two power supply potential lines 7a provided on the fourth wiring layer 5d are provided on both longitudinal ends (the upper and lower ends in FIG. 1) of the uppermost (fifth) wiring layer 5e in the macro cell part 1. Further, fifth-layer ground potential lines 8b for connecting the two fourth-layer ground potential lines 8a are provided on both longitudinal ends (the upper and lower ends in FIG. 1) of the fifth wiring layer 5e. The main power supply potential lines 7a and the main ground potential lines 8a correspond to the "first main power supply wires" in the present invention, and the main power supply potential lines 7b and the main ground potential lines 8b correspond to the "second main power supply wire" in the present invention.

The auxiliary power supply potential lines 11 branching from the first-layer connection wire 9a electrically connected with the main power supply potential lines 7a and the auxiliary ground potential lines 12 branching from the first-layer connection wire 9a (not shown) electrically connected with the main ground potential lines 8a are formed to extend along the longitudinal direction (the horizontal direction in FIG. 1) of the respective basic cell strings 3a in the first wiring layer 5a. The auxiliary power supply potential lines 11 and the auxiliary ground potential lines 12 are alternately arranged to hold the basic cell strings 3a therebetween. The auxiliary power supply potential lines 11 and the auxiliary ground potential lines 12 correspond to the "auxiliary power supply wire" in the present invention.

According to the first embodiment, the main power supply potential lines 7a and 7b and the main ground potential lines 8a and 8b are arranged in the region of the macro cell part 1 as described above, whereby the area of the circuit can be saved as compared with the conventional case of arranging the main power supply potential lines 7a and 7b and the main ground potential lines 8a and 8b outside the region of the macro cell part 1.

Further, the macro cell part 1 is formed in the multilayer wiring structure having the five wiring layers 5a to 5e, whereby a margin for wiring in the macro cell part 1 can be improved. Consequently, the power supply potential lines 7a and 7b and the main ground potential lines 8a and 8b can be readily arranged in the region of the macro cell part 1.

In other words, the basic cell strings 3a including the transistors 1a to 1c can be arranged under the main power supply potential lines 7a and 7b and the main ground potential lines 8a and 8b by forming the main power supply potential lines 7b and the main ground potential lines 8b by the uppermost fifth wiring layer 5e and forming the main power supply potential lines 7a and the main ground potential lines 8a by the fourth wiring layer 5d next to the uppermost wiring layer 5e. Thus, signal lines between the basic cell strings 3a can be efficiently connected through the first wiring layer 5a and the second wiring layer 5b with no hindrance by the main power supply potential lines 7a and 7b and the main ground potential lines 8a and 8b.

(Second Embodiment)

A macro cell part 20 of a semiconductor integrated circuit according to a second embodiment of the present invention is now described with reference to FIGS. 3 and 4. According to the second embodiment, main power supply potential lines and main ground potential lines located on a basic cell region are subdivided dissimilarly to the aforementioned first embodiment. The remaining structure of the second embodiment is basically similar to that of the first embodiment. The second embodiment is now described in detail.

Figure 3:
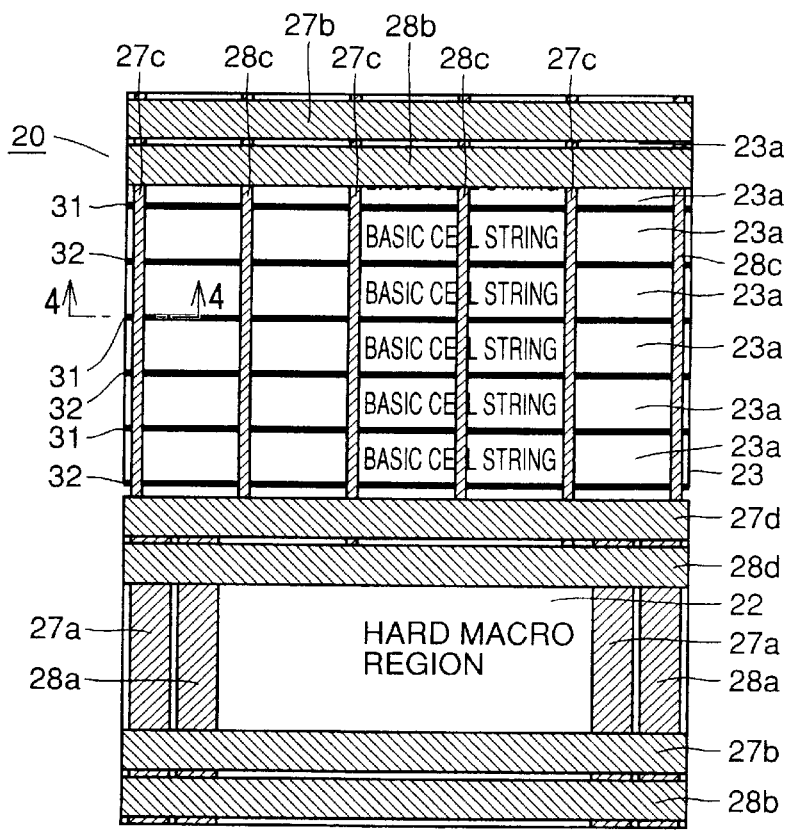
FIG. 3 is a plan view schematically showing the structure of a macro cell part of a semiconductor integrated circuit according to a second embodiment of the present invention.

According to the second embodiment, main power supply potential lines 27c and main ground potential lines 28c located on a basic cell region 23 are subdivided as shown in FIG. 3. More specifically, 20 main power supply potential lines 27c and 20 main ground potential lines 28c are provided in a width of ½₀ the wiring width of main power supply potential lines 27a and main ground potential lines 28a located on a hard macro region 22. The subdivided main power supply potential lines 27c and the subdivided main ground potential lines 28c are arranged over the entire basic cell region 3 substantially at regular intervals. In order to simplify the illustration, FIG. 3 shows only three main power supply potential lines 27c and only three main ground potential lines 28c respectively. The number of the main power supply potential lines 27c and the main ground potential lines 28c, preferably as many as possible, may be properly decided in consideration of the wiring layout.

Connection wires 29a to 29c (see FIG. 4) are provided in correspondence to the subdivided main power supply potential lines 27c and the subdivided main ground potential lines 28c. A contact plug 30d connects each main power supply potential line 27 and each connection wire 29c with each other, while a contact plug 30c connects each connection wire 29c and each connection wire 29b with each other. A contact plug 30b connects each connection wire 29b and each connection wire 29a with each other. The contact plugs 30b, 30c and 30d correspond to the "connection hole wire" according to the present invention. Auxiliary power supply potential lines 31 are provided to branch from the connection wires 29a.

According to the second embodiment, the connection wires 29a to 29c are set to a width substantially identical to that of the narrow subdivided main power supply potential lines 27c and the subdivided narrow main ground potential lines 28c. Thus, the width of the connection wires 29a to 29c is so reduced that only a single contact plug 20d connects each main power supply potential line 27c and each connection wire 29c, only a single contact plug 20c connects each connection wire 29c and each connection wire 29b and only single contact plug 20b connects each connection wire 29b and each connection wire 29a respectively. In this case, the semiconductor integrated circuit according to the second embodiment has a larger number of main power supply potential lines 27c and main ground potential lines 28c as compared with the first embodiment, whereby there is no apprehension that potential loss is increased in the paths between the main power supply potential lines 27a and the auxiliary power supply potential lines 31 and between the main ground potential lines 28c and the auxiliary ground potential lines 32 although the number of the contact plugs connected with each main power supply potential line 27c and each main ground potential line 28c is small.

A main power supply potential line 27b connected with an end of each subdivided main power supply potential line 27c and a main ground potential line 28b connected with an end of each subdivided main ground potential line 28c are provided on the longitudinal upper end (the upper end in FIG. 3) of the macro cell part 20. Further, a main power supply potential line 27d connected with another end of each main power supply potential line 27c and a main ground potential line 28d connected with another end of each main ground potential line 28c are provided on the boundary between the hard macro region 22 and the basic cell region 23. The main power supply potential line 27d and the main ground potential line 28d correspond to the "third main power supply wire" in the present invention. In addition, the main power supply potential line 27b connected with single ends of the two main power supply potential lines 27a located on the hard macro region 22 and the main ground potential line 28b connected with single ends of the two main ground potential lines 28a located on the hard macro region 22 are provided on the longitudinal lower end (the lower end in FIG. 3) of the macro cell part 20.

In the second embodiment, interlayer isolation films 24a to 24e isolate five wiring layers 20a to 20e from each other. A contact plug 30c connects internal wires 26b and 26c with each other, and a contact plug 30e connects internal wires 26d and 26e with each other. The connection wire 29a and the auxiliary power supply potential lines 31 are connected to a cell substrate 101 through contact plugs 30a respectively. Various active elements such as transistors 21a to 21c forming basic cell strings 23a are formed on the surface of the cell substrate 101. An internal wire 26b connects the transistors 21b and 21c with each other.

The auxiliary power supply potential lines 31 and the auxiliary ground potential lines 32 are formed to extend along the longitudinal direction (the horizontal direction in FIG. 3) of the basic cell strings 23a. Further, the auxiliary power supply potential lines 31 and the auxiliary ground potential lines 32 are alternately arranged to hold the basic cell strings 23a therebetween.

According to the second embodiment, the main power supply potential lines 27c and the main ground potential lines 28c located on the basic cell region 23 are subdivided in the aforementioned manner, so that the main power supply potential lines 27c and the main ground potential lines 28c are reduced in width on the subdivided regions. Thus, the degree of freedom in layout of internal wires in the basic cell region 23 is increased as compared with the case of having wide main power supply potential lines 27c and wide main ground potential lines 28c. Consequently, wiring efficiency for the internal wires in the basic cell region 23 can be improved.

Figure 4:
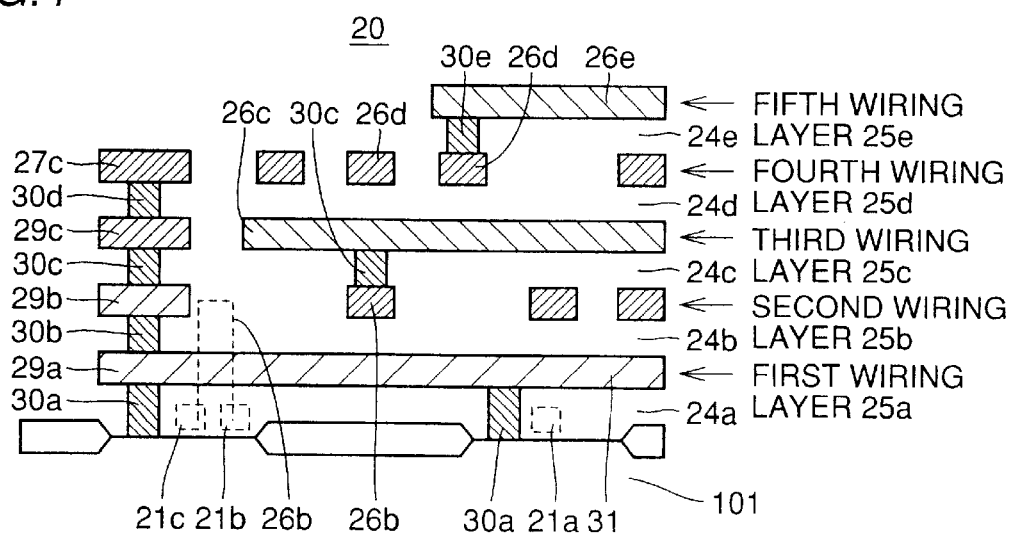
FIG. 4 is a sectional view of the macro cell part according to the second embodiment taken along the line 200—200 in FIG. 3.

More specifically, consider the case of connecting the two transistors 21b and 21c provided on the cell substrate 101 with each other by the second-layer internal wire 26b in FIG. 4, for example. Although the transistors 21b and 21c are located in the vicinity of the second-layer connection wire 29b, the thin connection wire 29b does not hinder this connection. Therefore, the internal wire 26b shown by dotted lines in FIG. 4 can connect the transistors 21b and 21c with each other with a small wiring distance. In the first embodiment shown in FIG. 2, on the other hand, the main power supply potential line 7a has a large width and hence the second-layer connection wire 9b also has a large width in correspondence thereto. In this case, the second-layer internal wire 6b connecting the transistors 1b and 1c with each other must remarkably detour in order not to come into contact with the connection wire 9b, as shown by dotted lines in FIG. 2. Therefore, wiring efficiency is deteriorated. According to the second embodiment shown in FIG. 4, as hereinabove described, wiring efficiency for the internal wires can be improved as compared with the first embodiment shown in FIG. 2.

According to the second embodiment, further, the auxiliary power supply potential lines 31 are connected in common with the plurality of subdivided main power supply potential lines 27c through the connection wires 29a to 29c, so that the length of the auxiliary power supply potential line 31 connected between each pair of adjacent main power supply potential lines 27c is reduced as compared with that for the main power supply potential lines 27c not subdivided. Thus, resistance of the auxiliary power supply potential 31 is reduced between each pair of main power supply potential lines 27c. Consequently, a voltage drop across each pair of main power supply potential lines 27c can be reduced. This also applies to the main ground potential lines 28b and the auxiliary ground potential lines 32.

According to the second embodiment, the main power supply potential lines 27c and the main ground potential lines 28c are smaller in width than the main power supply potential lines 27a and the main ground potential lines 28a, and hence resistance of the main power supply potential lines 27c and the main ground potential lines 28c is increased. However, only a small quantity of current flows through each main power supply potential line 27c and each main ground potential line 28c and causes only a small voltage drop, to result in no particular problem.

According to the second embodiment shown in FIG. 3, the main power supply potential lines 27c and the main ground potential lines 28c are arranged along the longitudinal direction (the horizontal direction in FIG. 3) of the basic cell strings 23a substantially at regular intervals, whereby dispersion of potentials resulting from a voltage drop can be suppressed as viewed form the overall basic cell region 3. Consequently, a malfunction caused by a local voltage drop can be suppressed. In the first embodiment shown in FIG. 1, the main power supply potential lines 7a and the main ground potential lines 8a are arranged only on the ends of the basic cell region 3 and not arranged on the central portion of the basic cell region 3, to result in a large voltage drop on the central portion of the basic cell region 3. In the second embodiment shown in FIG. 3, on the other hand, the main power supply potential lines 27c and the main ground potential lines 28c are regularly arranged over the entire basic cell region 23, whereby dispersion of voltage drops is advantageously reduced over the entire basic cell region 23.

In general, terminals to be connected with the main power supply potential lines 27a and the main ground potential lines 28a are provided on the periphery of the hard macro region 22. In this case, the main power supply potential lines 27a and the main ground potential lines 28a located on the hard macro region 22 are not subdivided and hence readily connected with such terminals.

(Third Embodiment)

A third embodiment of the present invention is now described with reference to FIG. 5. The third embodiment is described with reference to a digital camera comprising an ASIC part 150 including the aforementioned macro cell part according to the first or second embodiment.

Figure 5:
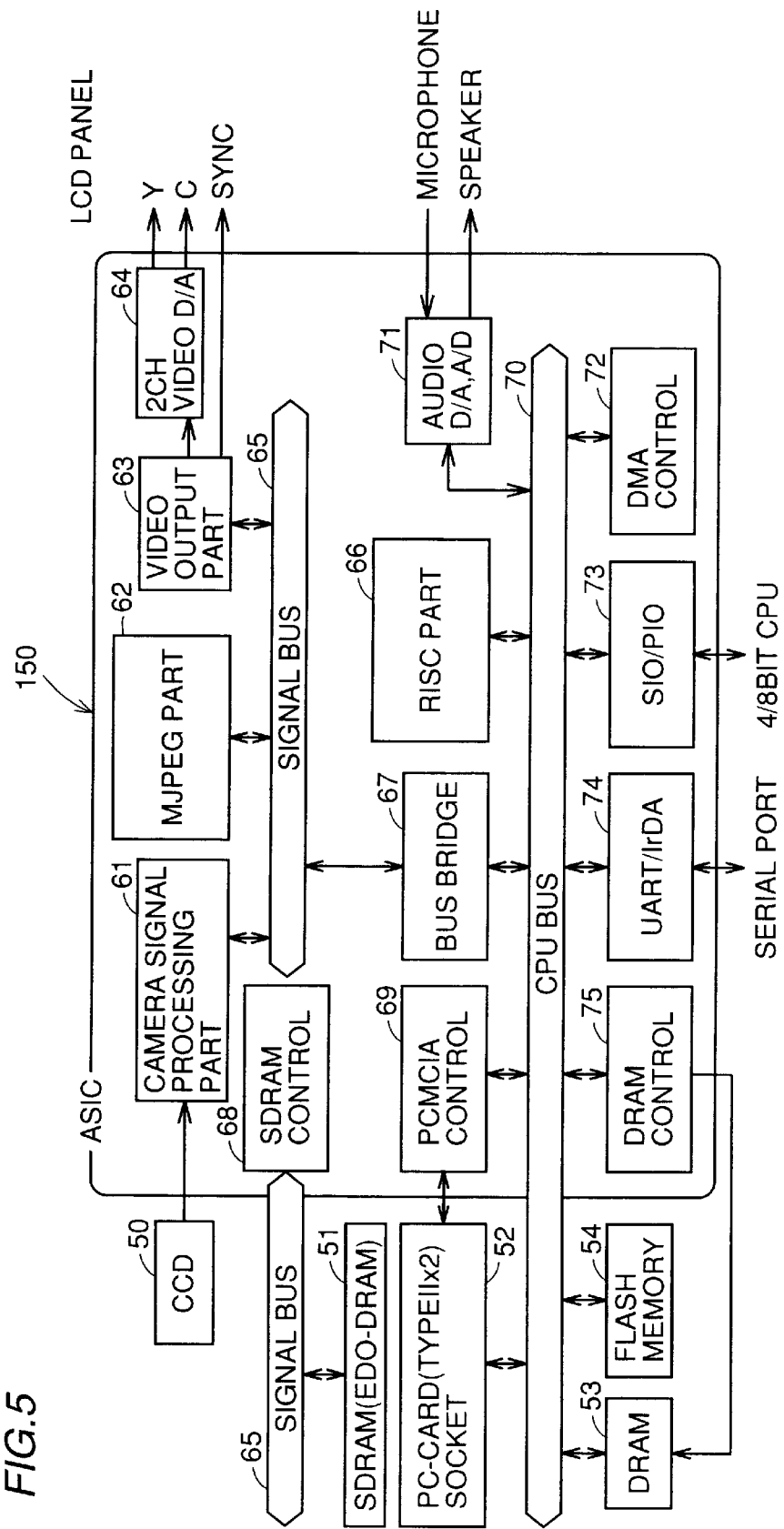
FIG. 5 is a block diagram for illustrating the structure of a digital camera comprising the semiconductor integrated circuit including the macro cell part according to the first or second embodiment.

Referring to FIG. 5, the ASIC part 150 of this digital camera includes a camera signal processing part 61, an MJPEG part 62, a video output part 63, a video D-A converter 64, a signal bus 65, a RISC part 66, a bus bridge 67, an SDRAM control part 68, a PCMCIA control part 69, a CPU bus 70, an audio D-A/A-D converter 71, a DMA control part 72, an SIO/PIO part 73, an UART/IrDA part 74 and a DRAM control part 75.

In the aforementioned ASIC part 150, the RISC part 66 is a part corresponding to the macro cell part 1 or 20 according to the first or second embodiment.

In the digital camera shown in FIG. 5, a CCD 50, an SDRAM (EDO-DRAM) 51, a PC card socket 52, a DRAM 53 and a flash memory 54 are arranged outside the ASIC part 150.

Photographing operations of the digital camera having the aforementioned structure are now described. As to the mechanism (signal flow) of the digital camera, the camera signal processing part 61 converts an image received from the CCD 50 to an electric signal. The camera signal processing part 61 performs processing of enhancing the contour of the acquired image for attaining clear appearance, adjusting color balance or focusing. The external SDRAM 51 stores image data subjected to such processing. This image data is displayed on a liquid crystal monitor through an NTSC encoder.

When the shutter of the digital camera is released, the image data is transferred to the MJPEG part 62 and compressed. The compressed code data is transferred to the RISC part (macro cell part) 66 and converted to a still picture file and thereafter stored in the flash memory 54. When reproducing a motion picture, 15 QVGA images are processed in a second for reproducing the motion picture. In reproduction, a still picture or a motion picture is projected on liquid crystals through a path opposite to the above. The RISC part 66 including a 32-bit RISC-CPU controls all these operations and processes sound in real time. As to the sound reproduced with the motion picture, the RISC part 66 data-processes sound received from a microphone and records the same in a single file along with the image data. A one-chip LSI (the ASIC part 150) performs all these operations, and this ASIC part 150 serves as the brain of the digital camera.

When applying the structure of the macro cell part 1 according to the first embodiment shown in FIG. 1 to the RISC part 66 of the ASIC part 150 of the digital camera according to the third embodiment, main power supply potential lines and main ground potential lines can be arranged in the region of the RISCK part 66. Thus, the circuit area of the digital camera can be saved.

When applying the structure of the macro cell part 20 according to the second embodiment shown in FIG. 3 to the RISC part 66 of the ASIC part 150 of the digital camera according to the third embodiment, main power supply potential lines and main ground potential lines arranged in the region of the RISC part 66 can be partially subdivided. Thus, the width of the main power supply potential lines and the main ground potential lines is reduced in the subdivided regions. Therefore, the degree of freedom in layout of internal wires in the RISC part 66 is increased in these regions as compared with main power supply potential lines and main ground potential lines having a large width. Consequently, wiring efficiency for the internal wires can be improved. Thus, a digital camera including the RISC part 66 having high wiring efficiency can be provided.

Although the present invention has been described and illustrated in detail, it is clearly understood that the same is by way of illustration and example only and is not to be taken by way of limitation, the spirit and scope of the present invention being limited only by the terms of the appended claims.

For example, while the basic cell strings are designed by the standard cell system in each of the aforementioned embodiments, the present invention is not restricted to this but basic cell strings designed in the gate array system (including a master slice system) may alternatively be employed.

In the second embodiment, the main power supply potential line 27b and the main ground potential line 28b may be subdivided.

In each of the aforementioned embodiments, the macro cell part may have a wiring structure of layers other than five layers.

As to the low-potential side main power supply wire, the main ground potential lines may be replaced with wires of a positive or negative potential.

What is claimed is:

1. A semiconductor integrated circuit comprising:
   a macro cell part having a plurality of wiring layers;

an internal wire of said macro cell part formed by said wiring layers of said macro cell part; and a main power supply wire formed by said wiring layers of said macro cell part and arranged in the region of said macro cell part;

said main power supply wire at least partially subdivided in the wire-width direction.

2. The semiconductor integrated circuit according to claim 1, wherein said main power supply wire includes a plurality of first main power supply wires formed by the same said wiring layer.

3. The semiconductor integrated circuit according to claim 2, wherein said main power supply wire includes a second main power supply wire connecting said first main power supply wires with each other.

4. The semiconductor integrated circuit according to claim 1, wherein said macro cell part has a multilayer wiring structure, and said main power supply wire is formed by an arbitrary wiring layer of multilayer wiring in said macro cell part, said semiconductor integrated circuit further comprising a connection wiring layer formed by another wiring layer of multilayer wiring in said macro cell part and electrically connected with said main power supply wire.

5. The semiconductor integrated circuit according to claim 4, wherein said main power supply wire and said connection wiring layer are connected with each other by a connection hole wire.

6. The semiconductor integrated circuit according to claim 5, wherein said main power supply wire and said connection wiring layer are connected with each other by at least two connection hole wires.

7. A semiconductor integrated circuit comprising:

a macro cell part having a multilayer wiring structure, an internal wire of said macro cell part formed by said multilayer wiring in said macro cell part, a main power supply wire formed by an arbitrary wiring layer of multilayer wiring in said macro cell part and arranged in the region of said macro cell part, and said semiconductor integrated circuit further comprising a connection wiring layer formed by another wiring layer of multilayer wiring in said macro cell part and electrically connected with said main power supply wire, wherein the width of said connection wiring layer is substantially equal to the width of said main power supply wire.

8. The semiconductor integrated circuit according to claim 7, wherein said macro cell part includes a cell string having a semiconductor element, and said cell string having said semiconductor element is arranged under said main power supply wire.

9. The semiconductor integrated circuit according to claim 8, wherein said macro cell part includes a cell region consisting of a plurality of said cell strings, an auxiliary power supply wire is connected to said main power supply wire through said connection wiring layer, and said auxiliary power supply wire is formed to extend along the longitudinal direction of said cell strings of said cell region.

10. The semiconductor integrated circuit according to claim 4, wherein said main power supply wire includes:
a plurality of first main power supply wires prepared from a first wiring layer, and
a second main power supply wire prepared from a second wiring layer for connecting said first main power supply wires with each other.

11. The semiconductor integrated circuit according to claim 10, wherein said macro cell part has at least three wiring layers, for forming either said first main power supply wires or said second main power supply wire by uppermost said wiring layer while forming either said second main power supply wire or said first said main supply wires by a wiring layer next to said uppermost wiring layer.

12. The semiconductor integrated circuit according to claim 1, wherein said main power supply wire includes at least one of a high-potential side main power supply wire and a low-potential side main power supply wire.

13. The semiconductor integrated circuit according to claim 12, wherein said high-potential side main power supply wire includes a main power supply potential line, and said low-potential side main power supply wire includes a main ground potential line.

14. The semiconductor integrated circuit according to claim 1, wherein said main power supply wire is at least partially subdivided.

15. The semiconductor integrated circuit according to claim 14, wherein a connection wiring layer is connected to each of a plurality of said subdivided main power supply wires.

16. A semiconductor integrated circuit comprising:

a macro cell part having a plurality of wiring layers;

an internal wire of said macro cell part formed by said wiring layers of said macro cell part; and a main power supply wire formed by said wiring layers of said macro cell part and arranged in the region of said macro cell part, wherein said main power supply wire is at least partially subdivided, a connection wiring layer connected to each of a plurality of said subdivided main power supply wires, and an auxiliary power supply wire connected in common to said plurality of subdivided main power supply wires through said connection wiring layer.

17. The semiconductor integrated circuit according to claim 14, wherein said plurality of subdivided main power supply wires are arranged substantially at regular intervals.

18. A semiconductor integrated circuit comprising:

a macro cell part having a plurality of wiring layers;

an internal wire of said macro cell part formed by said wiring layers of said macro cell part; and a main power supply wire formed by said wiring layers of said macro cell part and arranged in the region of said macro cell part, wherein said main power supply wire is at least partially subdivided, said macro cell part includes a cell region of a standard cell system, and said main power supply wire is subdivided in said cell region of said standard cell system.

19. A semiconductor integrated circuit comprising:
a macro cell part having a plurality of wiring layers;
an internal wire of said macro cell part formed by said wiring layers of said macro cell part; and
a main power supply wire formed by said wiring layers of said macro cell part and arranged in the region of said macro cell part, wherein said main power supply wire is at least partially subdivided,
said macro cell part includes a cell region of a gate array system, and
said main power supply wire is subdivided in said cell region of said gate array system.

20. The semiconductor integrated circuit according to claim 14, wherein
said main power supply wire includes a plurality of first main power supply wires prepared from the same said wiring layer.

21. The semiconductor integrated circuit according to claim 20, wherein
said main power supply wire includes a second main power supply wire connecting said first main power supply wires with each other.

22. A semiconductor integrated comprising:
a macro cell part having a plurality of wiring layers;
an internal wire of said macro cell part formed by said wiring layers of said macro cell part; and
a main power supply wire formed by said wiring layers of said macro cell part and arranged in the region of said macro cell part, wherein said main power supply wire is at least partially subdivided,
said main power supply wire includes a third main power supply wire for connecting a plurality of subdivided parts of said main power supply wire to each other.

23. The semiconductor integrated circuit according to claim 14, wherein
said macro cell part has a multilayer wiring structure, and
said main power supply wire is formed by an arbitrary wiring layer of multilayer wiring in said macro cell part,
said semiconductor integrated circuit further comprising a connection wiring layer formed by another wiring layer of multilayer wiring in said macro cell part and electrically connected with said main power supply wire.

24. The semiconductor integrated circuit according to claim 23, wherein
said main power supply wire and said connection wiring layer are connected with each other by a connection hole wire.

25. A semiconductor integrated circuit comprising:
a macro cell part having a plurality of wiring layers and a multilayer wiring structure;
an internal wire of said macro cell part formed by said wiring layers of said macro cell part; and
a main power supply wire formed by said wiring layers of said macro cell part and arranged in the region of said macro cell part, wherein said main power supply wire is at least partially subdivided, said main power supply wire is formed by an arbitrary wiring layer of multilayer writing in said macro cell part,
said semiconductor integrated circuit further comprising a connection wiring layer formed by another wiring layer of multilayer wiring in said macro cell part and electrically connected with said main power supply wire,
said macro cell part includes a cell string having a semiconductor element, and
said cell string having said semiconductor element is arranged under said main power supply wire.

26. The semiconductor integrated circuit according to claim 25, wherein
said macro cell part includes a cell region consisting of a plurality of said cell strings,
said main power supply wire is subdivided in said cell region,
an auxiliary power supply wire is connected in common to said subdivided main power supply wire through said connection wiring layer, and
said auxiliary power supply wire is formed to extend along the longitudinal direction of said cell strings of said cell region.

27. The semiconductor integrated circuit according to claim 23, wherein
said main power supply wire includes:
a plurality of first main power supply wires prepared from a first wiring layer, and
a second main power supply wire prepared from a second wiring layer for connecting said first main power supply wires with each other.

28. A semiconductor integrated circuit comprising:
a macro cell part having a plurality of wiring layers;
an internal wire of said macro cell part formed by said wiring layers of said macro cell part; and
a main power supply wire formed by said wiring layers of said macro cell part and arranged in the region of said macro cell part, wherein said main power supply wire is at least partially subdivided,
said macro cell part has a multilayer wiring structure, and
said main power supply wire is formed by an arbitrary wiring layer of multilayer wiring in said macro cell part, and includes:
a plurality of first main power supply wires prepared from a first wiring layer, and
a second main power supply wire prepared from a second wiring layer for connecting said first main power supply wires with each other,
said semiconductor integrated circuit further comprising a connection wiring layer formed by another wiring layer of multilayer wiring in said macro cell part and electrically connected with said main power supply wire, and
said macro cell part has at least three wiring layers, for forming either said first main power supply wires or said second main power supply wire by uppermost said wiring layer while forming either said second main power supply wire or said first said main supply wires by a wiring layer next to said uppermost wiring layer.

29. The semiconductor integrated circuit according to claim 14, wherein
said main power supply wire includes at least one of a high-potential side main power supply wire and a low-potential side main power supply wire.

30. The semiconductor integrated circuit according to claim 29, wherein
said high-potential side main power supply wire includes a main power supply potential line, and
said low-potential side main power supply wire includes a main ground potential line.

* * * * *